(12) United States Patent
Jung

(10) Patent No.: US 7,531,297 B2
(45) Date of Patent: May 12, 2009

(54) ORGANIC ANTI-REFLECTIVE COATING POLYMER, ORGANIC ANTI-REFLECTIVE COATING COMPOSITION AND METHOD FOR FORMING PHOTORESIST PATTERN

(75) Inventor: Jae Chang Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 262 days.

(21) Appl. No.: 11/485,749

(22) Filed: Jul. 13, 2006

(65) Prior Publication Data

US 2007/0099110 A1    May 3, 2007

(30) Foreign Application Priority Data

Oct. 31, 2005   (KR) ...................... 10-2005-0103343

(51) Int. Cl.
| G03F 7/11 | (2006.01) |
| G03F 7/30 | (2006.01) |
| G03F 7/40 | (2006.01) |
| C08F 16/34 | (2006.01) |
| C08F 114/18 | (2006.01) |

(52) U.S. Cl. .................... 430/325; 430/271.1; 430/326; 430/330; 430/272.1; 430/311; 525/328.7; 525/326.2

(58) Field of Classification Search ........................ None
See application file for complete search history.

(56) References Cited

U.S. PATENT DOCUMENTS

| 3,449,272 A * | 6/1969 | Wismer et al. ............. 525/54.2 |
| 5,886,102 A | 3/1999 | Sinta et al. |
| 6,489,432 B2 * | 12/2002 | Jung et al. .................. 528/230 |
| 6,835,532 B2 | 12/2004 | Jung ........................ 430/271.1 |

FOREIGN PATENT DOCUMENTS

| JP | 2003-185820 | 7/2003 |
| KR | 10-2004-0046350 A | 6/2004 |
| KR | 10-2006-0012823 A | 2/2006 |

* cited by examiner

*Primary Examiner*—Cynthia Hamilton
(74) *Attorney, Agent, or Firm*—Marshall, Gerstein & Borun LLP

(57) ABSTRACT

Disclosed herein is an organic anti-reflective coating polymer suitable for use in ultrafine pattern formation during fabrication of a semiconductor device. The organic anti-reflective coating polymer has a weight-average molecular weight of about 2,000 to about 100,000 and is represented by Formula 1 below:

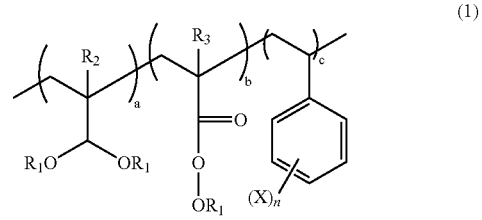

(1)

wherein $R_1$ is a C1-C5 linear or branched alkyl group, $R_2$ and $R_3$ are each independently hydrogen or methyl, X is halogen, n is a number from 1 to 5, and a, b and c, representing the mole fraction of each monomer, are each independently from about 0.1 to about 0.9. Also disclosed are an organic anti-reflective coating composition comprising the coating polymer and a method for forming a photoresist pattern with the coating composition.

18 Claims, 2 Drawing Sheets

ORGANIC ANTI-REFLECTIVE COATING POLYMER, ORGANIC ANTI-REFLECTIVE COATING COMPOSITION AND METHOD FOR FORMING PHOTORESIST PATTERN

BACKGROUND OF THE DISCLOSURE

1. Field of the Disclosure

The present disclosure relates to an organic anti-reflective coating polymer suitable for use in ultrafine pattern formation during fabrication of a semiconductor device, an organic anti-reflective coating composition comprising the coating polymer, and a method for forming a photoresist pattern with the coating composition.

2. Description of the Related Art

In recent years, as semiconductor devices have become smaller in size and more densely integrated, photoresist patterns have necessarily become finer. It is thus necessary to make the linewidths of photoresist patterns finer. To prevent disruption of photoresist patterns arising from the aspect ratio of the photoresist patterns, the photoresist patterns must be formed to a predetermined thickness or less, taking the linewidths of the photoresist patterns into consideration. For example, when it is intended to form a sub-70 nm fine pattern, the linewidths of a photoresist pattern must not be larger than 70 nm. Accordingly, the photoresist pattern must be formed to a thickness of a maximum of 150 nm. If the photoresist pattern has a thickness larger than 150 nm, disruption of the photoresist pattern takes place due to the aspect ratio of the photoresist pattern.

Organic anti-reflective coatings are formed under photoresist patterns in order to absorb light emitted from an exposure light source so as to prevent damage to the photoresist pattern due to diffuse reflection or standing waves, etc. from an underlayer, which is to be etched and patterned by the photoresist pattern, upon exposure to light. As the thickness of the photoresist pattern becomes smaller, the thickness of the organic anti-reflective coating formed under the photoresist pattern must also become smaller.

Under such circumstances, since currently used organic anti-reflective coatings typically have a low refractive index of 1.5 to 1.65, organic anti-reflective coatings having a small thickness cannot exhibit desired light absorption properties in response to exposure light sources, and as a result, they cannot sufficiently prevent damage to photoresist patterns due to diffuse reflection, etc. from the underlayer upon exposure to light.

For these reasons, although a photoresist pattern has a small thickness, an organic anti-reflective coating having a thickness of at least 30 nm is currently formed under the photoresist pattern. As a result, the organic anti-reflective coating is not completely removed during etching and removing the organic anti-reflective coating and underlayer, using the photoresist pattern as a mask, and consequently insufficient patterning of the underlayer occurs.

In view of the above-mentioned problems, there is a continuous need to develop an organic anti-reflective coating material which has a high refractive index (e.g., 1.70 or higher) so as to allow an organic anti-reflective coating to exhibit desired light absorption properties in response to an exposure light source when the organic anti-reflective coating is formed to a small thickness under a photoresist pattern, thereby preventing damage to the photoresist pattern due to diffused and reflected light, etc. from an underlayer upon exposure to light.

SUMMARY OF THE DISCLOSURE

The present disclosure provides an organic anti-reflective coating polymer which allows an organic anti-reflective coating to exhibit desired light absorption properties in response to an exposure light source when the organic anti-reflective coating is formed to a small thickness under a photoresist pattern, thereby preventing damage to the photoresist pattern due to diffused and reflected light, etc. from an underlayer upon exposure to light.

The present disclosure also provides an organic anti-reflective coating composition comprising the coating polymer.

The present disclosure further provides a method for forming a photoresist pattern with the coating composition.

In accordance with one aspect of the present disclosure, there is provided an organic anti-reflective coating polymer having a weight-average molecular weight of about 2,000 to about 100,000, represented by Formula 1 below:

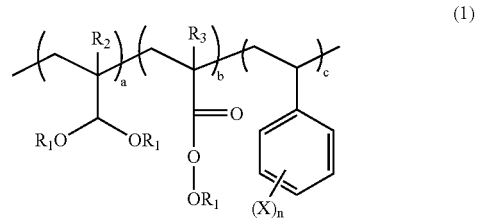

(1)

wherein $R_1$ is C1-C5 linear or branched alkyl, $R_2$ and $R_3$ are each independently hydrogen or methyl, X is halogen, n is a number from 1 to 5, and a, b and c, representing the mole fraction of each monomer, are each independently from about 0.1 to about 0.9.

Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment. A particularly preferred organic anti-reflective coating polymer of Formula 1 according to the present disclosure has the structure wherein $R_1$ is methyl, $R_2$ is methyl, $R_3$ is hydrogen, X is 4-bromo, and n is 1.

As will be evident from the following examples, a halogen-substituted aromatic group present in the organic anti-reflective coating polymer of the present disclosure allows an organic anti-reflective coating formed using the coating polymer to have a refractive index of about 1.7 or higher. Accordingly, although an organic anti-reflective coating using the organic anti-reflective coating polymer is formed to a small thickness (e.g., about 30 nm or less) under a photoresist pattern, desired light absorption properties of the organic anti-reflective coating are maintained in response to an exposure light source, thereby serving to prevent damage to the photoresist pattern due to diffused and reflected light or standing waves, etc. from an underlayer.

Further, the organic anti-reflective coating polymer of Formula 1 basically functions as a crosslinking polymer of an organic anti-reflective coating composition. In addition to the halogen-substituted aromatic group, the organic anti-reflective coating polymer of the present disclosure further contains an acetal group. The acetal group functions to form a plurality of crosslinking bonds within an organic anti-reflective coating so that the organic anti-reflective coating can withstand a photoresist solvent without being dissolved.

The organic anti-reflective coating polymer of the present disclosure has a weight-average molecular weight of about 2,000 to about 100,000. When the organic anti-reflective coating polymer has a weight-average molecular weight of less than about 2,000, crosslinking bonds cannot be sufficiently formed within an organic anti-reflective coating and the refractive index of the organic anti-reflective coating is lowered. As a result, the organic anti-reflective coating is dissolved in a photoresist solvent, resulting in poor film-forming properties, and it does not exhibit desired light absorption properties in response to an exposure light source when it is formed to a small thickness, making it nearly impossible to show its antireflection functions under a photoresist pattern. Meanwhile, when the organic anti-reflective coating polymer has a weight-average molecular weight exceeding about 100,000, crosslinking bonds are excessively formed within an organic anti-reflective coating so that the etch ratio of the organic anti-reflective coating may be lowered, and as a result, the organic anti-reflective coating cannot be completely removed under common etching conditions in the subsequent processes, including patterning.

The organic anti-reflective coating polymer of Formula 1 according to the present disclosure can be prepared by copolymerizing an acrolein monomer of Formula 3 below:

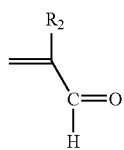

(3)

wherein $R_2$ is hydrogen or methyl, an alkyl acrylate monomer of Formula 4 below:

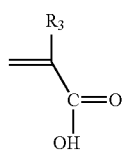

(4)

wherein $R_3$ is hydrogen or methyl, and
a halogenated styrene monomer of Formula 5 below:

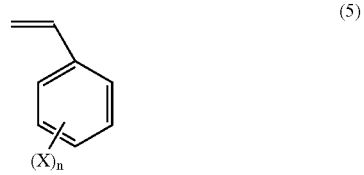

(5)

wherein X is halogen and n is a number from 1 to 5, in the presence of a radical polymerization initiator in an organic solvent, and reacting the copolymerization product with an alcohol represented by $R_1OH$ (in which $R_1$ is a C1-C5 linear or branched alkyl group) in the presence of p-toluenesulfonic acid.

The preparation of the organic anti-reflective coating polymer according to the present disclosure will be described more fully below. First, the acrolein monomer of Formula 3, the alkyl acrylate monomer of Formula 4 and the halogenated styrene monomer of Formula 5 are dissolved in an organic solvent, and then a radical polymerization initiator is added to the solution. Subsequently, the mixture is heated to a temperature of 60-70° C. for 4-8 hours under vacuum in order to polymerize the monomers. The resulting copolymerization product is reacted with an alcohol represented by $R_1OH$ (in which $R_1$ is a C1-C5 linear or branched alkyl group) at about 60 to about 80° C. in the presence of para-toluenesulfonic acid as a catalyst for about 20 to about 30 hours, giving the final polymer of Formula 1.

As the organic solvent used to prepare the organic anti-reflective coating polymer of the present disclosure, there can be used at least one solvent selected from the group consisting of propylene glycol methyl ether acetate (PGMEA), tetrahydrofuran (THF), cyclohexanone, dimethylformamide, dimethylsulfoxide, dioxane, methyl ethyl ketone, benzene, toluene, xylene, and mixtures thereof. Of course, other solvents can also be used.

The radical polymerization initiators used in the present disclosure may be any radical polymerization initiator commonly used for polymerization reactions, for example, 2,2-azobisisobutyronitrile (AIBN), benzoylperoxide, acetyl peroxide, lauryl peroxide, t-butyl peracetate, t-butyl hydroperoxide, or di-t-butyl peroxide.

In accordance with another aspect of the present disclosure, there is provided an organic anti-reflective coating composition, the composition comprising:

an organic anti-reflective coating polymer having a weight-average molecular weight of about 2,000 to about 100,000, represented by Formula 1 below:

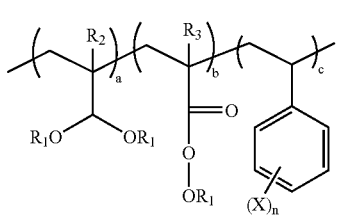

(1)

wherein $R_1$ is a C1-C5 linear or branched alkyl group, $R_2$ and $R_3$ are each independently hydrogen or methyl, X is halogen, n is a number from 1 to 5, and a, b and c, representing the mole fraction of each monomer, are each independently from about 0.1 to about 0.9;

a polyvinylphenol polymer of Formula 2 below:

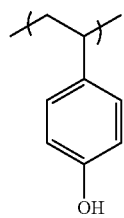

(2)

a thermal acid generator; and an organic solvent.

The organic anti-reflective coating composition of the present disclosure is characterized in that it comprises the organic anti-reflective coating polymer of Formula 1 as a crosslinking polymer. Conventional organic anti-reflective coating compositions comprise a crosslinking polymer containing an acetal group alone. In contrast, the organic anti-reflective coating composition of the present disclosure comprises the polymer of Formula 1, as a crosslinking polymer, containing both an acetal group and a halogen-substituted aromatic group. Accordingly, the organic anti-reflective coating composition of the present disclosure can be used to form an organic anti-reflective coating having a small thickness (e.g., about 30 nm or less) under a photoresist pattern, desired light absorption properties of the organic anti-reflective coating are maintained in response to an exposure light source, and damage to the photoresist pattern due to diffused and reflected light or standing waves, etc. from an underlayer is effectively prevented.

Particularly, as will be evident from the following examples, since an organic anti-reflective coating formed using the organic anti-reflective coating composition of the present disclosure has a high refractive index (e.g., about 1.70 or higher), it exhibits desired light absorption properties (attenuation coefficient (k) is equal to about 0.65) in response to an exposure light source even when it is formed under a photoresist pattern to a small thickness (about 30 nm (i.e., about 300 Å) or less) Accordingly, damage to the photoresist pattern due to diffused and reflected light or standing waves, etc. from an underlayer can be effectively prevented, and the formation of a high-quality vertical photoresist pattern can be achieved.

As described above, since the polymer of Formula 1 containing an acetal group can also function as a crosslinking polymer of the organic anti-reflective coating composition, the organic anti-reflective coating composition can be used to form a good organic anti-reflective coating (under a photoresist pattern), which is not dissolved in a photoresist solvent.

The thermal acid generator used in the organic anti-reflective coating composition of the present disclosure may be any material commonly used in the art. A preferred thermal acid generator is 2-hydroxycyclohexyl p-toluenesulfonate of Formula 6 below:

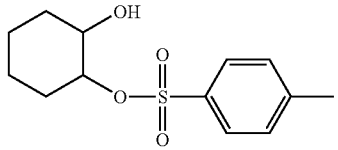

(6)

The thermal acid generator is a catalyst for activating a crosslinking reaction between the acetal group of the organic anti-reflective coating polymer of Formula 1 and the hydroxyl group of the polyvinylphenol polymer of Formula 2. When the organic anti-reflective coating composition of the present disclosure is applied to a wafer, thermal processing, e.g., baking, causes an acid to be generated from the thermal acid generator. A crosslinking reaction occurs in the presence of the acid generated from the thermal acid generator to form an organic anti-reflective coating that is not dissolved in a photoresist solvent.

Examples of suitable organic solvents that can be used in the organic anti-reflective coating composition of the present disclosure include any organic solvent commonly used in the art, and the organic anti-reflective coating composition solvent is preferably selected from the group consisting of ethyl 3-ethoxypropionate, methyl 3-methoxypropionate, cyclohexanone, propylene glycol methyl ether acetate (PGMEA), and mixtures thereof. Propylene glycol methyl ether acetate (PGMEA) is a preferred organic anti-reflective coating composition solvent.

The polyvinylphenol polymer of Formula 2 used as a light-absorbing agent in the organic anti-reflective coating composition of the present disclosure is preferably present in an amount of about 50 to about 200 parts by weight, based on 100 parts by weight of the polymer of Formula 1. The thermal acid generator is preferably present in an amount of about 10 to about 200 parts by weight, based on 100 parts by weight of the polymer of Formula 1. The solvent is preferably present in an amount of about 1,000 to about 10,000 parts by weight, based on 100 parts by weight of the combination of the polymer of Formula 1 and the polyvinylphenol polymer.

The organic anti-reflective coating composition of the present disclosure comprising the components defined above can be used to form an organic anti-reflective coating (under a photoresist pattern) that is not dissolved in a photoresist solvent and can effectively prevent diffusion and reflection of light, etc. from an underlayer, particularly when the components are within the content ranges defined above.

In accordance with yet another aspect of the present disclosure, there is provided a method for forming a photoresist pattern, the method comprising: applying the organic anti-reflective coating composition of the present disclosure on top of a layer to be etched; baking the resulting structure to crosslink the coating composition, thereby forming an organic anti-reflective coating; applying a photoresist layer on top of the organic anti-reflective coating; exposing the photoresist layer to light; and developing the photoresist layer to form a photoresist pattern.

According to the method of the present disclosure, an organic anti-reflective coating is formed under a photoresist using the organic anti-reflective coating composition of the present disclosure. Accordingly, even when the organic anti-reflective coating is formed to have a small thickness (e.g., about 30 nm or less) as the thickness of the photoresist becomes smaller, damage to the photoresist pattern due to diffused and reflected light or standing waves, etc. from the underlayer can be effectively prevented, and the formation of a high-quality vertical photoresist pattern can be achieved.

According to the method of the present disclosure, the baking is preferably conducted at about 150 to about 300° C. for about 1 to about 5 minutes. When the baking is conducted under the above conditions, an acid is generated from the thermal acid generator and a plurality of crosslinking bonds are formed to form an organic anti-reflective coating that is not dissolved in a photoresist solvent.

Further, according to the method of the present disclosure, baking may be additionally conducted after applying the photoresist layer and before and/or after exposure to a light source. The additional baking is preferably conducted at about 70 to about 200° C.

The anti-reflective coating composition and the photoresist pattern formation method of the present disclosure are mainly applied to processes for forming ultrafine patterns using an ArF light source (193 nm). Likewise, the composition and the method of the present disclosure can be applied to processes for forming ultrafine patterns using alternative light sources, such as KrF, deep-UV light (DUV), e.g., EUV, E-beam, X-rays and ion beams.

BRIEF DESCRIPTION OF THE DRAWINGS

The above features and other advantages of the present disclosure will be more clearly understood from the following detailed description taken in conjunction with the accompanying drawings, in which.

DESCRIPTION OF THE PREFERRED EMBODIMENTS

The present disclosure will now be described in more detail with reference to the following preferred examples. However, these examples are given for the purpose of illustration and are not to be construed as limiting the scope of the appended claims.

EXAMPLE 1

Preparation of Organic Anti-Reflective Coating Polymer 3 g of 4-bromostyrene, 4 g of acrolein, 3 g of methacrylate and 0.2 g of AIBN were sufficiently mixed with 50 g of PGMEA. The mixture was polymerized by heating the mixture at 67° C. for 8 hours. After completion of the polymerization, the polymerization product was precipitated in n-hexane, filtered, and dried in vacuo to give a poly(bromostyrene-acrolein-methacrylate) copolymer.

8 g of the copolymer was dissolved in a mixed solvent of methanol (100 g) and THF (100 g), and then 0.3 g of p-toluenesulfonic acid was added thereto. The mixture was allowed to react at reflux at 70° C. for 24 hours.

The reaction solution was concentrated to about 50 g using a rotary evaporator, precipitated in n-hexane, and filtered, affording poly(bromostyrene-3,3-dimethoxypropene-methylmethacrylate) of Formula 7 below:

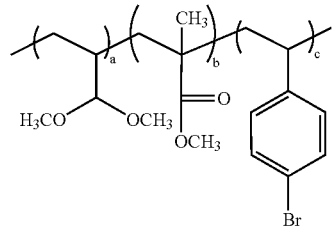

(7)

wherein a, b and c, representing the mole fraction of each of the monomers, are each independently from 0.1 to 0.9.

Figure 1:
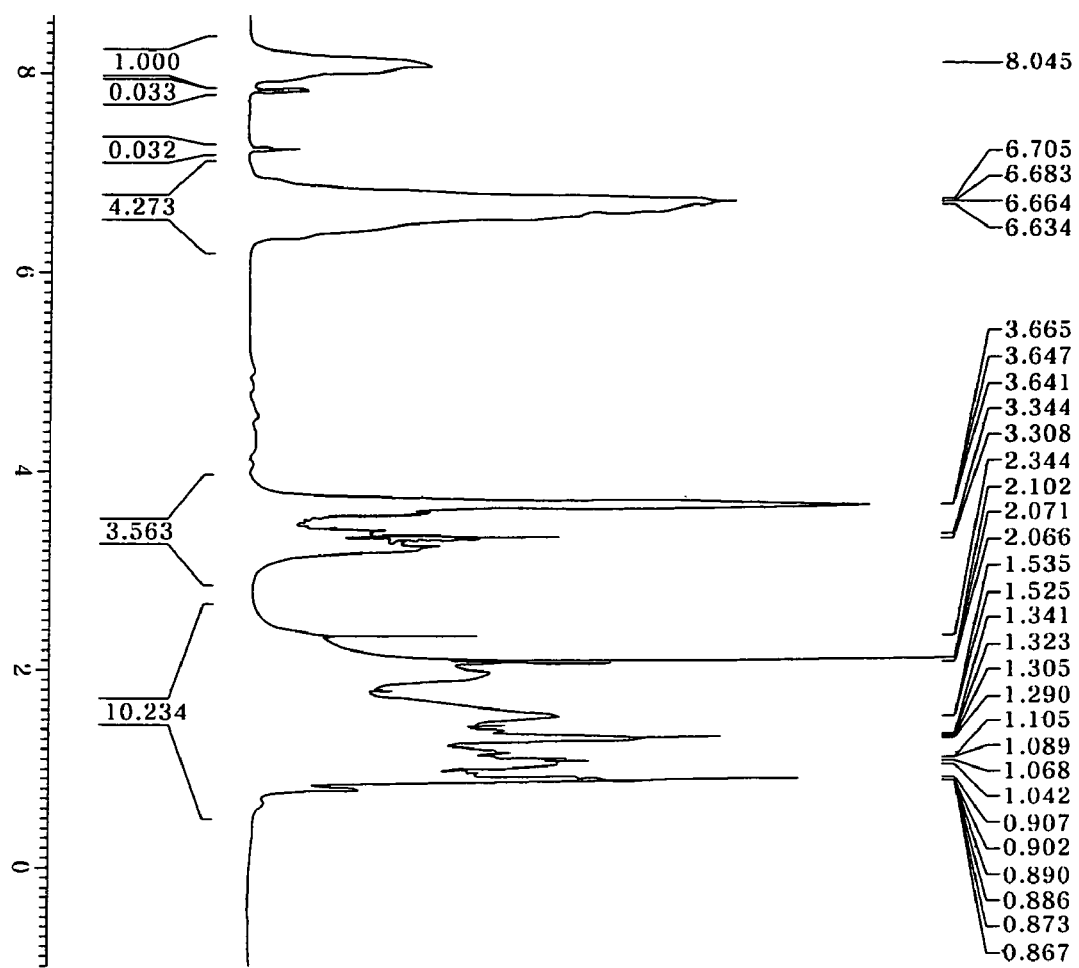
FIG. 1 is a 1H-NMR spectrum of an organic anti-reflective coating polymer prepared in Example 1 of the present disclosure.

The structure of the copolymer was identified by 1H-NMR spectroscopy (FIG. 1).

EXAMPLE 2

Formation of Organic Anti-Reflective Coating 1 g of the polymer of Formula 7 prepared in Example 1, 0.2 g of a polyvinylphenol polymer as a light-absorbing agent and 8 g of 2-hydroxycyclohexyl p-toluenesulfonate as a thermal acid generator were dissolved in 60 g of propylene glycol methyl ether acetate, and filtered through a microfilter (0.05 μm) to prepare an organic anti-reflective coating composition.

Thereafter, the organic anti-reflective coating composition was applied to a thickness of about 30 nm (300 Å) to a wafer, and baked at 230° C. for about one minute to form an organic anti-reflective coating.

The organic anti-reflective coating was measured to have a refractive index (n) of 1.72 and an attenuation coefficient (k) of 0.65.

EXAMPLE 3

Formation of Photoresist Pattern

An ArF-sensitive photoresist layer (AR1221J, JSR Corporation, Japan) was coated onto the organic anti-reflective coating formed in Example 2, and baked at 130° C. for 90 seconds. Thereafter, the resulting structure was exposed to light using an ArF scanner (NA=0.63, ASML), baked at 130° C. for 90 seconds, and developed with a 2.3 wt % tetra methyl ammonium hydroxide (TMAH) developing solution to form a final photoresist pattern. An image of the photoresist pattern is shown in FIG. 2.

Figure 2:
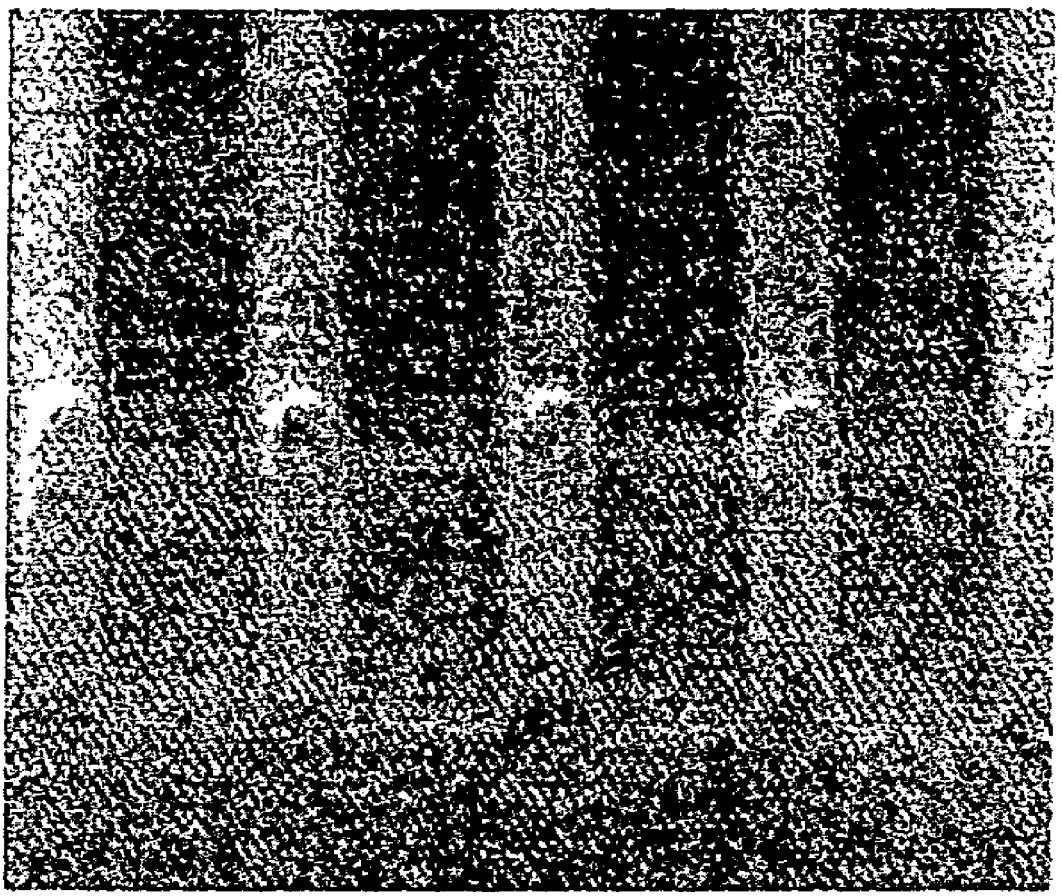
FIG. 2 is a scanning electron micrograph (SEM) of a photoresist pattern formed in Example 3 of the present disclosure.

As can be seen from the results of Examples 2 and 3 and the image shown in FIG. 2, because the organic anti-reflective coating formed with the organic anti-reflective coating composition has a refractive index higher than 1.70, it exhibits desired light absorption properties (high attenuation coefficient (k)=0.65) in response to the exposure light source even when it is formed to have a small thickness (e.g., 30 nm or less) and can therefore be successfully used under a photoresist layer having a small thickness. As a result, damage to the photoresist pattern due to diffused and reflected light or standing waves, etc. from the underlayer can be effectively prevented, and thus a photoresist pattern having high quality can be vertically formed.

As apparent from the above description, even when a photoresist layer in accordance with the disclosure is formed to a small thickness (which is often required because semiconductor devices have become smaller in size and more densely integrated), the organic anti-reflective coating composition can be used to form an organic anti-reflective coating having a small thickness, which is capable of effectively showing its antireflection functions.

In addition, an organic anti-reflective coating in accordance with the disclosure can be formed to a small thickness while effectively preventing damage to a photoresist pattern due to diffused and reflected light or standing waves, etc. from an underlayer upon exposure to light, and the formation of a high-quality vertical photoresist pattern can be achieved. Therefore, the organic anti-reflective polymer of the present disclosure can greatly contribute to miniaturization and high integration of semiconductor devices.

Although the preferred embodiments of the present disclosure have been disclosed for illustrative purposes, those skilled in the art will appreciate that various modifications, additions and substitutions are possible, without departing from the scope and spirit of the disclosure as recited in the accompanying claims.

What is claimed is:

1. An organic anti-reflective coating polymer having a weight-average molecular weight of about 2,000 to about 100,000, represented by Formula 1 below:

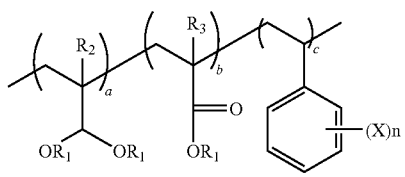

wherein $R_1$ is a C1-C5 linear or branched alkyl group, $R_2$ and $R_3$ are each independently hydrogen or methyl, X is halogen, n is a number from 1 to 5, and a, b and c, representing the mole fraction of each monomer, are each independently from about 0.1 to about 0.9.

2. The organic anti-reflective coating polymer according to claim 1, wherein the polymer has a weight-average molecular weight of 2,000 to 100,000, and a, b and c, are each independently from 0.1 to 0.9.

3. The organic anti-reflective coating polymer according to claim 1, wherein $R_1$ is methyl, $R_2$ is methyl, $R_3$ is hydrogen, X is bromine and n is 1.

4. The organic anti-reflective coating polymer according to claim 3, wherein the bromine is at the 4-position of the benzene ring.

5. A method for preparing an organic anti-reflective coating polymer of Formula 1 below:

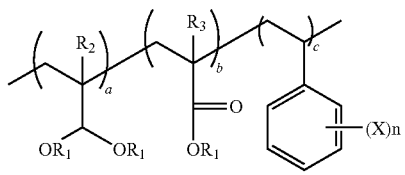

wherein $R_1$ is a C1-C5 linear or branched alkyl group, $R_2$ and $R_3$ are each independently hydrogen or methyl, X is halogen, n is a number from 1 to 5, and a, b and c, representing the mole fraction of each monomer, are each independently from about 0.1 to about 0.9, the method comprising:

copolymerizing an acrolein monomer of Formula 3 below:

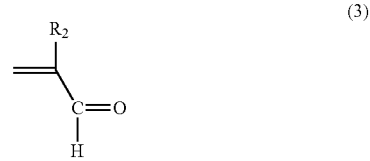

wherein $R_2$ is hydrogen or methyl;

an alkyl acrylate monomer of Formula 4 below:

wherein $R_3$ is hydrogen or methyl; and a halogenated styrene monomer of Formula 5 below:

wherein X is halogen and n is a number from 1 to 5, in the presence of a radical polymerization initiator in an organic solvent, and reacting the copolymerization product with an alcohol represented by $R_1OH$ (in which $R_1$ is a C1-C5 linear or branched alkyl group) in the presence of p-toluenesulfonic acid.

6. The method according to claim 5, wherein a, b and c, are each independently from 0.1 to 0.9.

7. The method according to claim 5, wherein the organic solvent is at least one solvent selected from the group consisting of propylene glycol methyl ether acetate (PGMEA), tetrahydrofuran (THF), cyclohexanone, dimethylformamide, dimethylsulfoxide, dioxane, methyl ethyl ketone, benzene, toluene, xylene, and mixtures thereof.

8. The method according to claim 5, wherein the polymerization initiator is selected from the group consisting of 2,2-azobisisobutyronitrile (AIBN), benzoyl peroxide, acetyl peroxide, lauryl peroxide, t-butyl peracetate, t-butyl hydroperoxide, and di-t-butyl peroxide.

9. An organic anti-reflective coating composition, the composition comprising:

an organic anti-reflective coating polymer having a weight-average molecular weight of about 2,000 to about 100,000, represented by Formula 1 below:

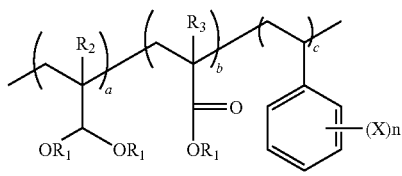

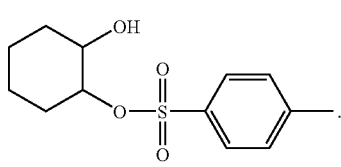

wherein $R_1$ is a C1-C5 linear or branched alkyl group, $R_2$ and $R_3$ are each independently hydrogen or methyl, X is halogen, n is a number from 1 to 5, and a, b and c, representing the mole fraction of each monomer, are each independently from about 0.1 to about 0.9;

a polyvinylphenol polymer of Formula 2 below:

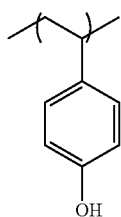

a thermal acid generator; and an organic solvent.

10. The organic anti-reflective coating composition according to claim 9, wherein the organic anti-reflective coating polymer has a weight-average molecular weight of 2,000 to 100,000, and a, b and c, are each independently from 0.1 to 0.9.

11. The composition according to claim 9, wherein the thermal acid generator is 2-hydroxycyclohexyl p-toluenesulfonate of Formula 6 below:

12. The method according to claim 11, further comprising baking after applying the photoresist layer and before or after exposing the photoresist layer.

13. The method according to claim 12, wherein the baking is conducted at about 70 to about 200° C.

14. The composition according to claim 9, wherein the polyvinylphenol polymer is present in an amount of about 50 to about 200 parts by weight, based on 100 parts by weight of the polymer of Formula 1.

15. The composition according to claim 11, wherein the thermal acid generator is present in an amount of about 10 to about 200 parts by weight, based on 100 parts by weight of the polymer of Formula 1.

16. The composition according to claim 11, wherein the solvent is present in an amount of about 1,000 to about 10,000 parts by weight, based on 100 parts by weight of the combination of the polymer of Formula 1 and the polyvinylphenol polymer.

17. The method according to claim 14, wherein the baking is conducted at about 150 to about 300° C. for about 1 to about 5 minutes.

18. A method for forming a photoresist pattern, comprising:
  applying the organic anti-reflective coating composition according to claim 9 on top of a layer to be etched;
  baking the resulting structure to crosslink the coating composition, thereby forming an organic anti-reflective coating;
  applying a photoresist layer on top of the organic anti-reflective coating;
  exposing the photoresist layer to light; and,
  developing the photoresist layer to form a photoresist pattern.

* * * * *